United States Patent
Muraki et al.

(10) Patent No.: US 6,903,353 B2
(45) Date of Patent: Jun. 7, 2005

(54) CHARGED PARTICLE BEAM EXPOSURE APPARATUS, DEVICE MANUFACTURING METHOD, AND CHARGED PARTICLE BEAM APPLIED APPARATUS

(75) Inventors: Masato Muraki, Tokyo (JP); Yasunari Sohda, Tokyo (JP); Shinichi Hashimoto, Tokyo (JP)

(73) Assignees: Canon Kabushiki Kaisha, Tokyo (JP); Hitachi, Ltd., Tokyo (JP); Advantest Corporation, Tokyo (JP)

( * ) Notice: Subject to any disclaimer, the term of this patent is extended or adjusted under 35 U.S.C. 154(b) by 65 days.

(21) Appl. No.: 10/125,439

(22) Filed: Apr. 19, 2002

(65) Prior Publication Data

US 2002/0160311 A1 Oct. 31, 2002

(30) Foreign Application Priority Data

Apr. 23, 2001 (JP) ........................... 2001-124758

(51) Int. Cl.$^7$ ............................................ H01J 37/153
(52) U.S. Cl. ................... 250/492.22; 250/396 R
(58) Field of Search ................ 250/492.22, 396 R, 250/492.23

(56) References Cited

U.S. PATENT DOCUMENTS

| | | | |
|---|---|---|---|
| 5,834,783 A | 11/1998 | Muraki et al. ............. 250/398 |
| 5,864,142 A | 1/1999 | Muraki et al. ........... 250/491.1 |
| 5,905,267 A | 5/1999 | Muraki .................. 250/492.22 |
| 5,929,454 A | 7/1999 | Muraki et al. ........... 250/491.1 |
| 5,939,725 A | 8/1999 | Muraki .................. 250/492.22 |
| 5,973,332 A | 10/1999 | Muraki et al. ........... 250/492.2 |
| 5,981,954 A | 11/1999 | Muraki ........................ 250/397 |
| 6,054,713 A | 4/2000 | Miyake et al. ......... 250/492.24 |
| 6,104,035 A | 8/2000 | Muraki .................. 250/492.22 |
| 6,107,636 A | 8/2000 | Muraki .................... 250/492.2 |
| 6,124,599 A | 9/2000 | Muraki .................. 250/492.22 |
| 6,137,113 A | 10/2000 | Muraki .................. 250/492.22 |
| 6,157,039 A | * 12/2000 | Mankos ................... 250/492.2 |
| 6,166,387 A | 12/2000 | Muraki et al. ........... 250/492.2 |
| 6,323,499 B1 | 11/2001 | Muraki et al. ......... 250/492.22 |
| 6,392,243 B1 | 5/2002 | Muraki .................... 250/491.1 |
| 6,566,664 B2 * | 5/2003 | Muraki .................... 250/492.2 |

FOREIGN PATENT DOCUMENTS

| | | |
|---|---|---|
| JP | 56-19402 | 2/1981 |
| JP | 2001-93825 | 4/2001 |
| KR | 1997-0067575 | 10/1997 |

OTHER PUBLICATIONS

Korean Office Action dated Mar. 9, 2004, issued in a corresponding Korean patent application, No. 10-2002-0021943.

* cited by examiner

*Primary Examiner*—Kiet T. Nguyen
(74) *Attorney, Agent, or Firm*—Fitzpatrick, Cella, Harper & Scinto

(57) ABSTRACT

A high-precision multi-charged-particle-beam exposure apparatus has a charged particle source (ES) that emits a charged particle beam. An aperture array (AA) having plural apertures divides the charged particle beam from the charged particle source (ES) into plural charged particle beams and a lens array (LA) having plural electron lens forms plural intermediate images of the charged particle source (ES) on substantially one plane with the plural charged particle beams from the aperture array (AA). A blanker array (BA) located on the plane where the plurality of intermediate images are to be formed has plural blankers, and a reduction electron optical system that reduces and projects the images of the charged particle source (ES) onto a substrate.

7 Claims, 9 Drawing Sheets

FIG. 9
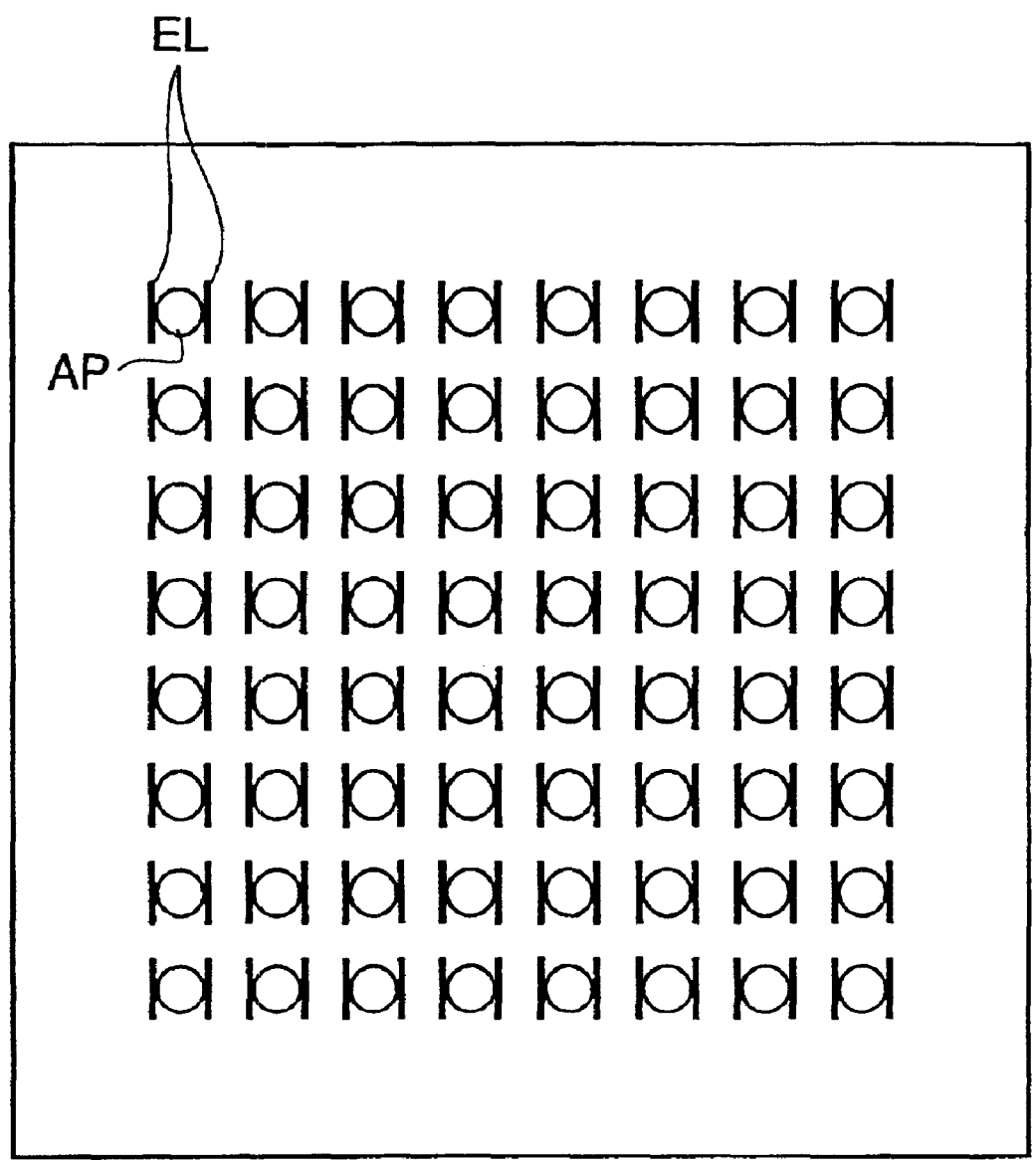
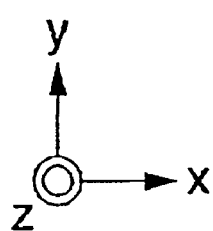

CHARGED PARTICLE BEAM EXPOSURE APPARATUS, DEVICE MANUFACTURING METHOD, AND CHARGED PARTICLE BEAM APPLIED APPARATUS

FIELD OF THE INVENTION

The present invention relates to a charged particle beam exposure apparatus, a device manufacturing method, and a charged particle beam applied apparatus and, more particularly, to a charged particle beam exposure apparatus for drawing a pattern on a substrate by using a plurality of charged particle beams, a device manufacturing method using the same, and a charged particle beam applied apparatus.

BACKGROUND OF THE INVENTION

An example of an electron beam exposure apparatus includes, e.g., a point beam type apparatus which uses an electron beam formed into a spot, a variable shaped beam type apparatus which uses an electron beam formed into a variable-size rectangle, and a stencil mask type apparatus with which a stencil mask having a beam passing hole with a desired shape is formed in advance and which uses a beam formed into a desired shape with the stencil.

Although the point beam type apparatus is suitable for forming a micropattern, it is used only for research and development as its throughput is very low. The variable shaped beam type apparatus has a throughput higher than that of the point beam type apparatus by one or two orders of magnitude. This throughput, however, is still low to draw a pattern in which micropatterns of about 100 nm are packed at a high integration degree.

An example of a method that draw any pattern includes an exposure method using a two-dimensional blanking aperture array (e.g., see Japanese Utility Model Publication No. 56-19402). According to this method, a plurality of apertures for passing beams through them are two-dimensionally arranged in a large number in a semiconductor crystal substrate made of silicon or the like. A pair of blanking electrodes are formed on the two ends of each aperture, and whether to apply a voltage across the electrodes is controlled in accordance with pattern data. In other words, according to this method, whether to cause the plurality of beams respectively passing through the plurality of apertures to travel linearly or to deflect them is controlled individually, thereby individually controlling whether the plurality of beams are to irradiate a sample. For example, when one of the electrodes on the two ends of each aperture is grounded and a voltage is applied to the other electrode, the beam passing through this aperture is deflected. This beam is shielded by an aperture stop set under the blanking aperture array and does not irradiate the sample. If the voltage is not applied to the other electrode, the electron beam passing through the aperture is not deflected. Thus, the beam is not shielded by the aperture stop set under the blanking aperture array, and irradiates the sample surface.

FIG. 9 schematically shows the arrangement of the two-dimensional blanking aperture array. In the two-dimensional blanking aperture array, a plurality of apertures (AP) are two-dimensionally arranged, and each aperture has a pair of electrodes (EL). The two-dimensional blanking array aperture has wiring lines and elements for individually controlling voltages to be applied to the electrodes of the plurality of apertures in accordance with pattern data. For example, the apertures (AP) have diameters of 20 $\mu$m and are arranged with pitches of 100 $\mu$m. Each electrode (EL) has a thickness of 10 $\mu$m, a width of 10 $\mu$m, and a length (in the direction of the depth) of about 50 $\mu$m.

In general, when the surface of a sample is scanned with an electron beam to draw a pattern with a line width of 100 nm, the spot size of the electron beam on the spot must be 25 nm or less.

Currently, however, the sizes of the apertures of the blanker array are limited to 10 $\mu$m×10 $\mu$m at minimum due to limitations in the manufacture. To reduce the spot size of the electron beam, the shape of which is defined by such an aperture, with a reduction electron optical system to 25 nm or less, the reduction electron optical system must have a reduction magnification of 400 times, which is actually difficult to achieve.

SUMMARY OF THE INVENTION

The present invention has been made in view of the above situation, and has as its object to realize micropattern drawing without increasing the performance of a reduction electron optical system.

It is another object of the present invention to obtain a plurality of controllable, very thin charged particle beams without increasing the performance of the reduction electron optical system.

According to the first aspect of the present invention, there is provided a charged particle beam exposure apparatus for drawing a pattern on a substrate by using a plurality of charged particle beams, comprising: a charged particle source for emitting a charged particle beam, an electron optical element for forming a plurality of intermediate images of the charged particle source within or in the vicinity of a plane, a blanker array obtained by arranging a plurality of blankers that individually control whether to shield the plurality of charged particle beams respectively forming the plurality of intermediate images, and a reduction electron optical system for reducing and projecting the intermediate images formed by the electron optical element onto a substrate, wherein the blanker array is arranged on the plane.

According to a preferred embodiment of the present invention, this charged particle beam exposure apparatus preferably further comprises a correction lens array arranged between the blanker array and the reduction electron optical system, and the correction lens array preferably has a plurality of electron lenses arranged for respectively forming virtual images of the plurality of intermediate images formed by the electron optical element at positions in accordance with an aberration of the reduction electron optical system.

According to the preferred embodiment of the present invention, the blankers arranged in the blanker array preferably deflect a charged particle beam that should be shielded and do not deflect a charged particle beam that should not be shielded, and the correction lens array preferably has a stopper array for shielding and passing therethrough, among a plurality of charged particle beams passing through the plurality of blankers arranged in the blanker array, deflected and undeflected charged particle beams, respectively.

According to the preferred embodiment of the present invention, the blankers arranged in the blanker array preferably deflect a charged particle beam that should be shielded and do not deflect a charged particle beam that should not be shielded, and the charged particle beam exposure apparatus preferably further comprises a stopper array for shielding and passing therethrough, among a plurality of charged particle beams passing through the plurality of blankers arranged in the blanker array, deflected and undeflected charged particle beams, respectively.

According to the preferred embodiment of the present invention, the electron optical element preferably has an aperture array obtained by arranging a plurality of apertures for passing the charged particle beam emitted by the charged particle source therethrough, and a lens array obtained by arranging a plurality of electron lenses for forming the plurality of intermediate images on the plane with the plurality of charged particle beams respectively passing through the plurality of apertures.

According to the second aspect of the present invention, there is provided a device manufacturing method including the steps of: applying a photosensitive material on a substrate, drawing a pattern on the substrate coated with the photosensitive material with the above charged particle beam exposure apparatus, and developing the photosensitive material on the substrate drawn with the pattern.

According to the third aspect of the present invention, there is provided a charged particle beam applied apparatus comprising: a charged particle source for emitting a charged particle beam, an electron optical element for forming a plurality of intermediate images of the charged particle source substantially within or in the vicinity of a plane, a blanker array obtained by arranging a plurality of blankers that individually control whether to shield the plurality of charged particle beams respectively forming the plurality of intermediate images, and a reduction electron optical system for reducing and projecting the intermediate images formed by the electron optical element onto a substrate, wherein the blanker array is arranged on the plane.

According to the fourth aspect of the present invention, there is provided a charged particle beam exposure apparatus for drawing a pattern on a substrate by using a plurality of charged particle beams, comprising: an electron optical element for focusing each of the plurality of charged particle beams within or in the vicinity of a plane, a blanker array obtained by arranging a plurality of blankers that individually control whether to shield the plurality of charged particle beams, and an electron optical system for projecting the plurality of charged particle beams from the blanker array onto a substrate, wherein the blanker array is arranged on the plane.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 9 is a view for explaining a blanker array in a conventional multi-charged-particle-beam exposure apparatus.

DETAILED DESCRIPTION OF THE PREFERRED EMBODIMENT

An electron beam exposure apparatus will be shown as an example of an exposure apparatus that utilizes a charged particle beam. Note that the present invention is not limited to an exposure apparatus that uses an electron beam but can be similarly applied to, e.g., an exposure apparatus that uses an ion beam.

Figure 1:
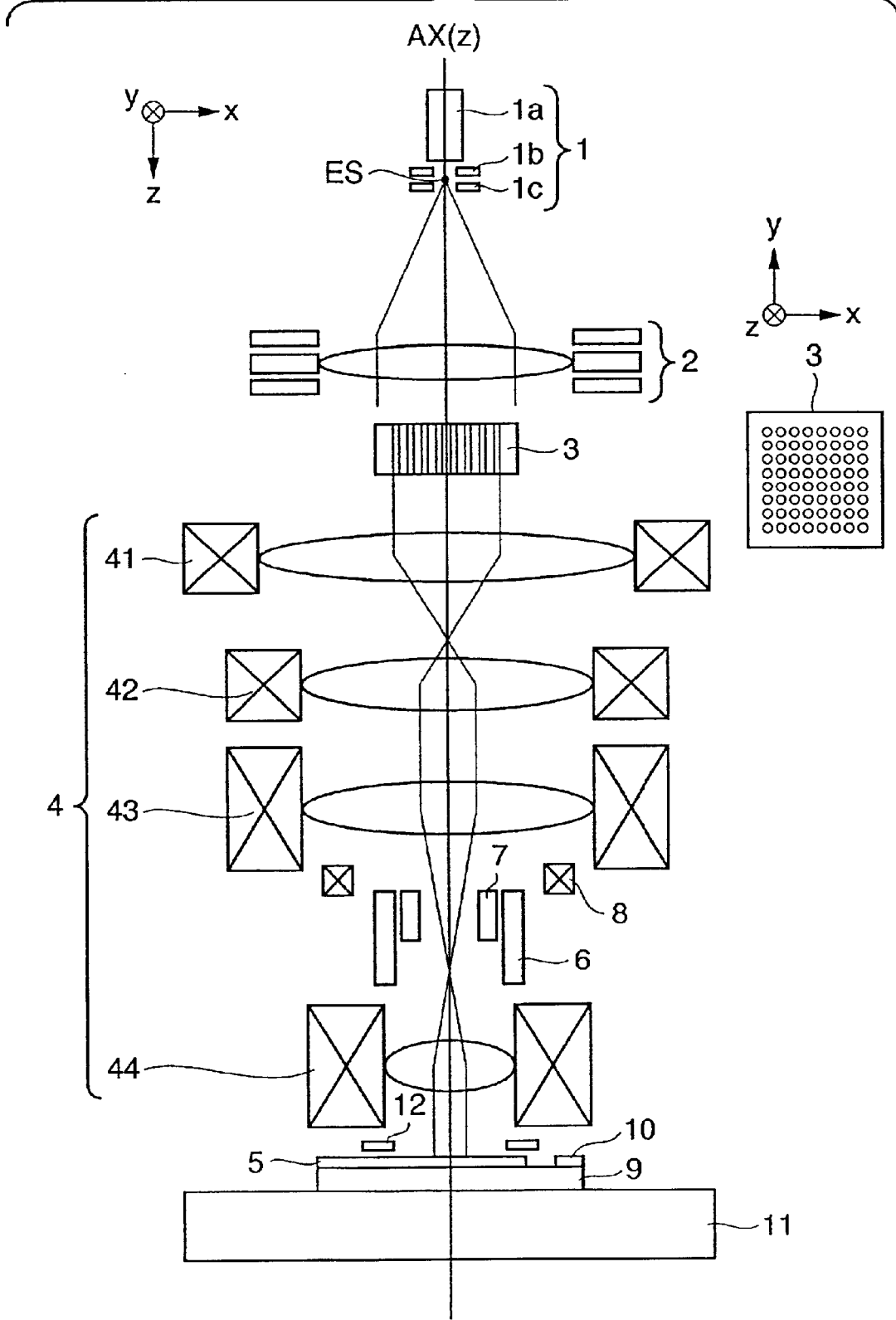
FIG. 1 is a view showing the schematic arrangement of an electron beam exposure apparatus according to a preferred embodiment of the present invention.

FIG. 1 is a view showing the schematic arrangement of an electron beam exposure apparatus according to a preferred embodiment of the present invention.

This electron beam exposure apparatus adopts an electron gun 1 as a charged particle beam source. The electron gun 1 is constituted by a cathode 1a, a grid 1b, and an anode 1c. Electrons emitted from the cathode 1a from a cross-over image between the grid 1b and anode 1c. In the following description, this cross-over image is called an electron source ES.

An electron beam emitted from the electron source ES is formed by a condenser lens optical system 2 into a substantially parallel electron beam, which then irradiates a multi-beam forming optical system 3. Typically, the condenser lens 2 is comprised of an electron lens (unipotential lens) made up of three aperture electrodes.

The multi-beam forming optical system 3 is comprised of an aperture array AA, deflector array DA, lens array LA, blanker array BA, and correction lens array CLA sequentially arranged from the electron gun 1 side along an optical axis AX. The detailed arrangement of the multi-beam forming optical system 3 will be described later.

The multi-beam forming optical system 3 forms a plurality of intermediate images of the electron source ES. The respective intermediate images are reduced and projected by a reduction electron optical system 4 (to be described later) onto a wafer (sample) 5. Hence, the images of the electron source ES are formed on the wafer 5.

The reduction electron optical system 4 is comprised of symmetric magnetic tablets constituted by a first projection lens 41 (43) and second projection lens 42 (44). The distance between the two lenses 41 and 42 is f1+f2 where f1 is the focal length of the first projection lens 41 (43) and f2 is the focal length of the second projection lens 42 (44). The object point on the optical axis AX is located at the focal position of the first projection lens 41 (43), and the image point thereof is located at the focal position of the second projection lens 42 (44). The image is reduced to −f2/f1. When the two lens magnetic fields are determined to act in opposite directions, theoretically, Seidel aberrations excluding five aberrations, i.e., spherical aberration, isotropic astigmatism, isotropic comatic aberration, curvature of field, and on-axis chromatic aberration, and chromatic aberrations concerning rotation and magnification are canceled.

A deflector 6 deflects the plurality of electron beams from the multi-beam forming optical system 3 to displace the plurality of images of the electron source ES in the X and Y directions on the wafer 5 by substantially the same displacement amounts. Although not shown, the deflector 6 is comprised of a main deflector used when the deflection width is large, and a subdeflector used when the deflection width is small. The main deflector is typically an electromagnetic deflector, and the subdeflector is typically an electrostatic deflector.

A dynamic focus coil 17 corrects an error in focal position of the image of the electron source ES which is caused by deflection aberration occurring when the deflector 6 is operated. A dynamic stigmatic coil 8 corrects astigmatism of the deflection aberration caused by deflection.

A θ-Z stage 9 places the wafer 5 on it and moves in the direction of the optical axis AX (Z-axis) and a rotational direction about the Z-axis. A stage reference plate 10 is fixed to the θ-Z stage 9.

An X-Y stage 11 moves the θ-Z stage 9 in X and Y directions perpendicular to the optical axis AX (Z-axis).

A reflected electron detector 12 detects reflected electrons produced when a mark on the stage reference plate 10 is irradiated with the electron beam.

The multi-beam forming optical system 3 mounted on the electron beam exposure apparatus shown in FIG. 1 will be described with reference to FIG. 2.

Figure 2:
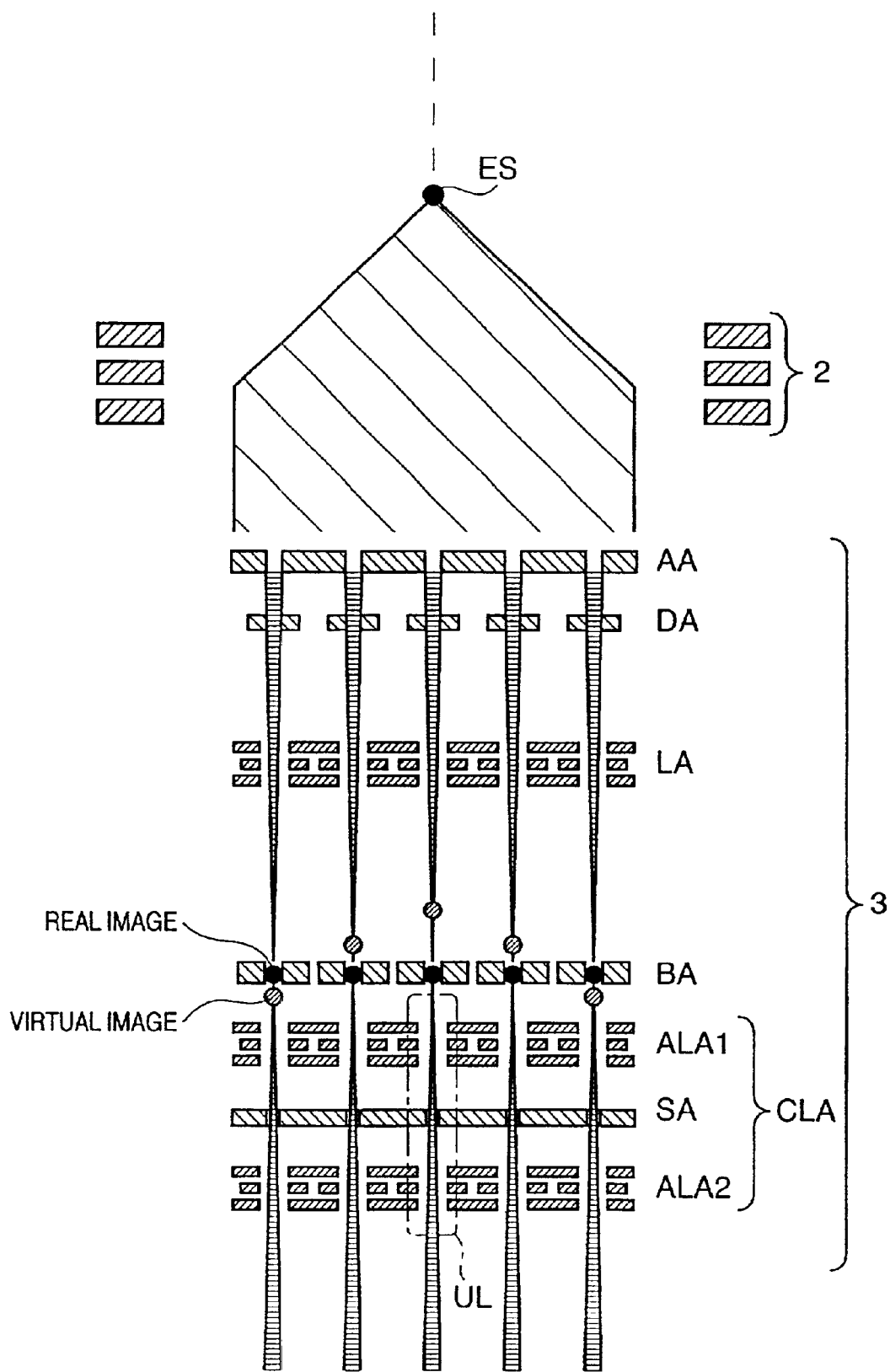
FIG. 2 is a view for explaining the detailed arrangement of a multi-beam electron optical system 3 shown in FIG. 1.

As shown in FIG. 2, the multi-beam forming optical system 3 is typically comprised of the aperture array AA, deflector array DA, lens array LA, blanker array BA, and correction lens array CLA.

The aperture array AA is formed of a substrate with a plurality of apertures. One electron beam which is made by the condenser lens 2 to be almost parallel is divided into a plurality of electron beams when it passes through the plurality of apertures.

The deflector array DA is obtained by forming a plurality of deflectors, that individually deflect the plurality of electron beams divided by the aperture array AA, on one substrate. This substrate has a plurality of apertures. This substrate also has four pairs of electrodes arranged to sandwich the corresponding apertures. Namely, the apertures have eight deflection electrodes with deflecting functions. This substrate also has wiring lines for individually operating the deflection electrodes.

The lens array LA is basically comprised of three substrates each having a plurality of aperture electrodes. One upper aperture electrode, one intermediate aperture electrode, and one lower aperture electrode form one electron lens (a so-called unipotential lens). In other words, the lens array LA has a plurality of electron lenses arrayed two-dimensionally. The same potential is applied to the upper, intermediate, and lower aperture electrodes so the plurality of electron lenses have the same optical characteristics (e.g., focal length).

Figure 3:
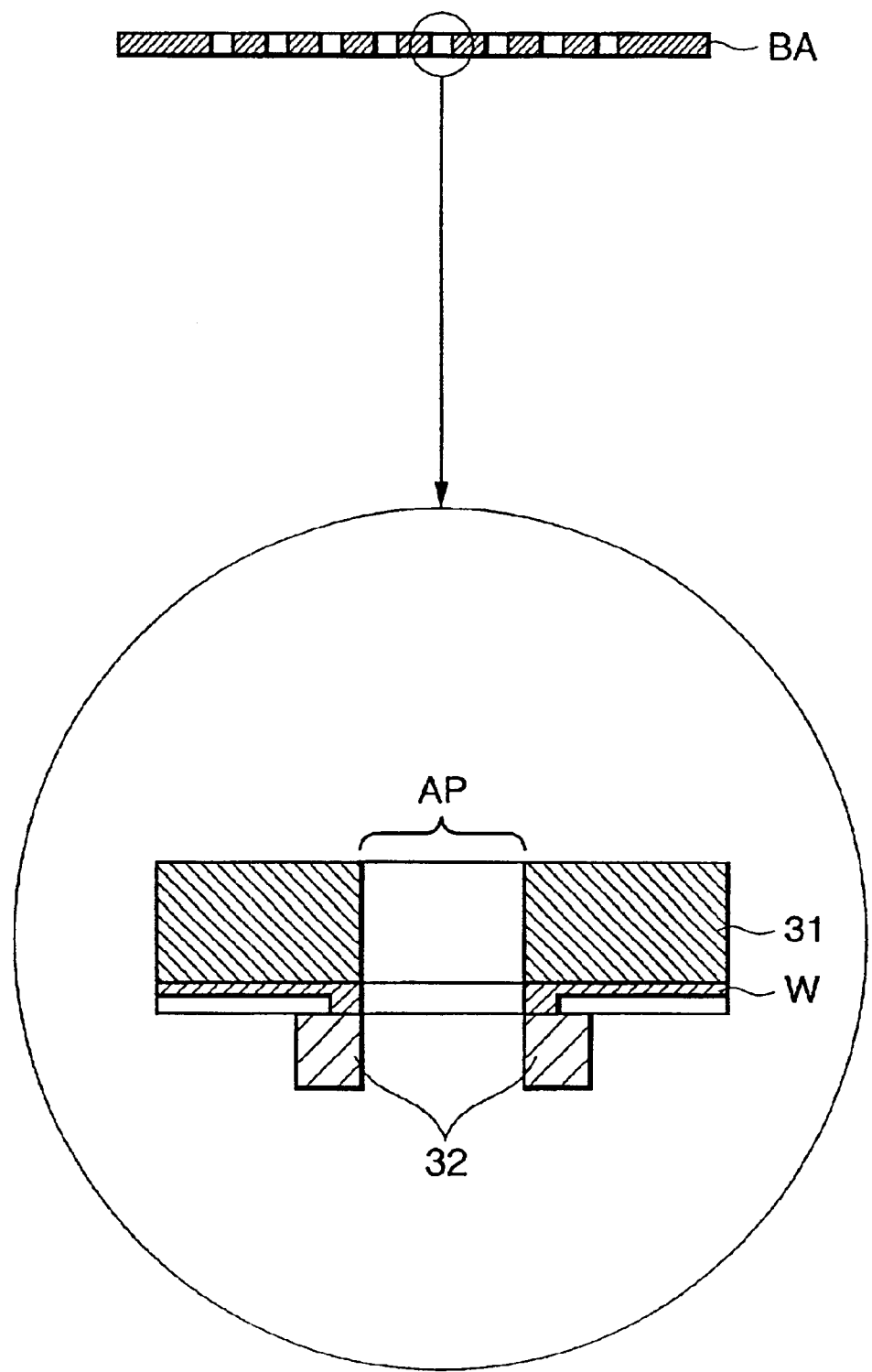
FIG. 3 is a view for explaining one deflector of a deflector array DA.

The blanker array BA is obtained by forming a plurality of deflectors that individually deflect the plurality of electron beams on one substrate. FIG. 3 shows one of these deflectors in detail. A substrate 31 has apertures AP and pairs of deflection electrodes 32 each sandwiching the corresponding aperture AP. The substrate 31 also has wiring lines (W) for individually controlling the plurality of deflection electrodes 32, thereby individually controlling deflection of the plurality of electron beams.

The correction lens array CLA is comprised of first and second electron lens arrays ALA1 and ALA2, each of which is an electron lens array formed by arranging a plurality of electron lenses two-dimensionally within one plane, and the stopper array SA.

Figure 4:
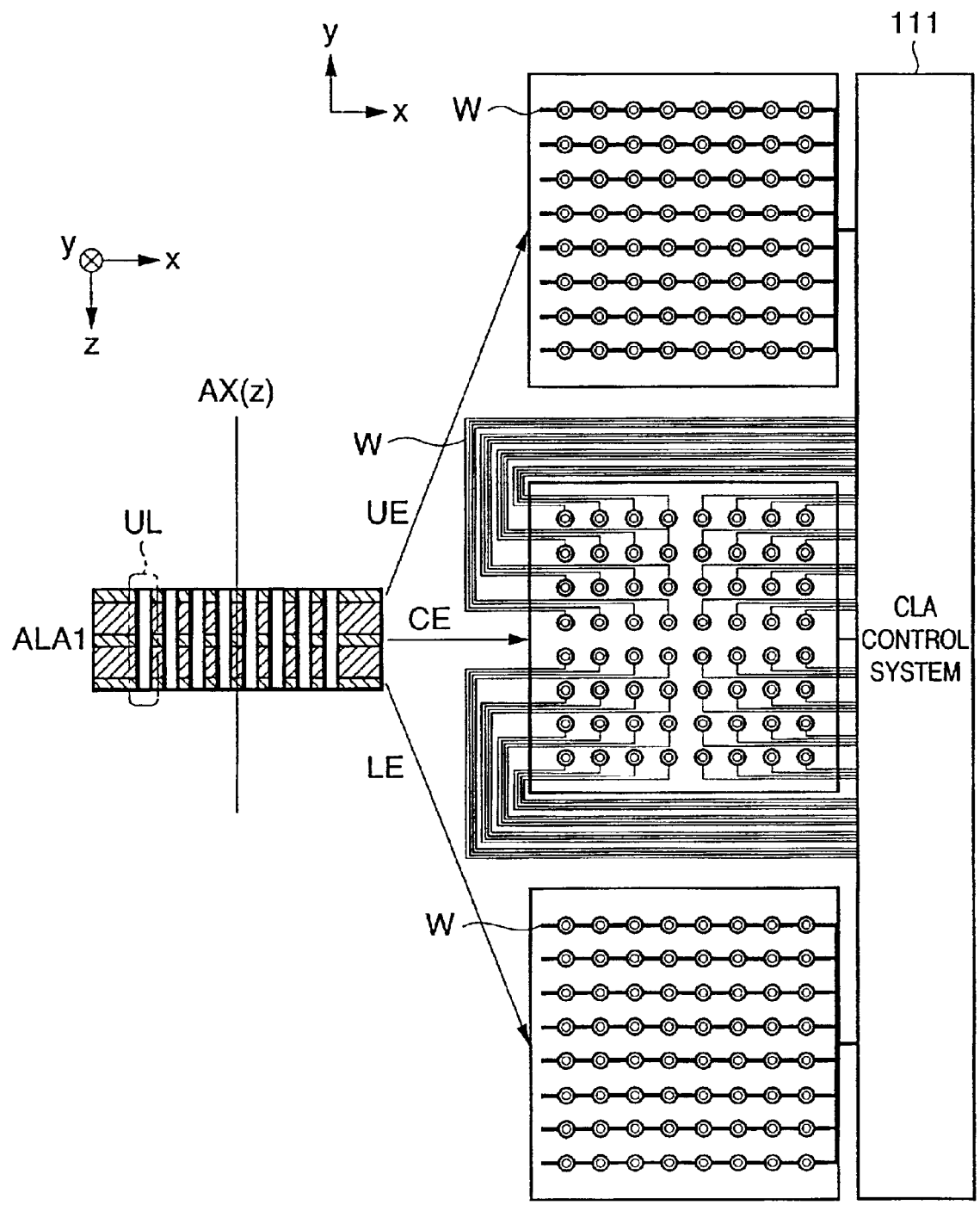
FIG. 4 is a view for explaining a first electron optical system ALA1.

FIG. 4 is a view for explaining the first electron optical system array ALA1. The first electron lens array ALA1 has three electrodes, i.e., upper, intermediate, and lower electrode plates UE, CE, and LE, each having a plurality of annular electrodes arranged in rows to correspond to the plurality of apertures. The three electrode plates are overlaid on each other through insulators. The annular electrodes with the same X and Y coordinates on the upper, intermediate, and lower electrode plates serve as one electron lens (a so-called unipotential lens) UL. All the annular electrodes of the upper and lower electrode plates of the respective electron lenses UL are connected to a CLA control circuit 111 through common wring lines (W), and are set at the same potential. In this example, the potentials of the upper and lower annular electrodes serve as electron beam accelerating potentials.

The annular electrodes of the intermediate electrode plates of the respective electron lenses are connected to the CLA control circuit 111 through the individual wiring lines (W), and are set to desired potentials. Thus, the electron optical power (focal length) of each electron lens UL can be set to a desired value. The second electron lens array ALA2 has the same structure and function as those of the first electron lens array ALA1.

The stopper array SA has the same structure as that of the aperture array AA.

The function of the multi-beam forming optical system 3 will be described with reference to FIG. 2. The substantially parallel electron beam passing through the condenser lens 2 is divided into a plurality of electron beams by the aperture array AA. The plurality of divided electron beams form a plurality of intermediate images of the electron source ES on the blanker array BA through the plurality of corresponding electron lenses of the lens array LA. The intermediate images depend not on the sizes of the apertures of the aperture array AA or of the apertures of the deflector array DA, but on the size of the electron source (cross-over image) ES. As the size of the electron source ES can be reduced comparatively easily, the size of the image of the electron source ES to be formed on the wafer 5 can be reduced to, e.g., 25 nm or less. Therefore, a micropattern with a line width of, e.g., 100 nm or less, can be drawn. The plurality of electron lenses of the lens array LA form the plurality of intermediate images (real images) of the electron source ES on substantially one plane (i.e., within or in the vicinity of the plane). The blanker array BA is arranged such that its deflection points are located on this plane.

The plurality of electron beams passing through the plurality of apertures of the blanker array BA become incident on the reduction electron optical system 4 through the plurality of electron lenses of the correction lens array CLA corresponding to them. The respective electron lenses UL arranged in the correction lens array CLA form the virtual images of the plurality of intermediate images of the electron source ES formed within the plane of the blanker array BA. More specifically, the intermediate images of the electron source ES are formed at positions other than the front focal positions of the respective electron lenses UL each comprised of two lenses. The focal lengths of the two lenses that form each electron lens UL are adjusted such that the virtual images of the intermediate images (real images) are formed at positions where they cancel the curvature of field that occurs when the electron beams pass through the reduction electron optical system 4.

The electron beams deflected by the blanker array BA are shielded by the stopper array SA formed in the correction lens array CLA and thus do not irradiate the wafer 5. The electron beams not deflected by the blanker array BA are not shielded by the stopper array SA formed in the correction lens array CLA and thus irradiate the wafer 5.

As described above, according to this embodiment, the plurality of intermediate images (real images) are formed on substantially one plane and the blanker array BA is arranged such that its deflection points are located on this plane. Therefore, assuming that the stopper array SA does not exist, the electron beams deflected by the blanker array BA irradiate the positions on the wafer which are substantially the same to the positions irradiated with the electron beams not deflected by the blanker array BA. Such a feature provides an advantage that the electron beams do not irradiate the undesirable portion on the wafer during ON/OFF-control of the election beams by the blanker array BA.

Figure 5:
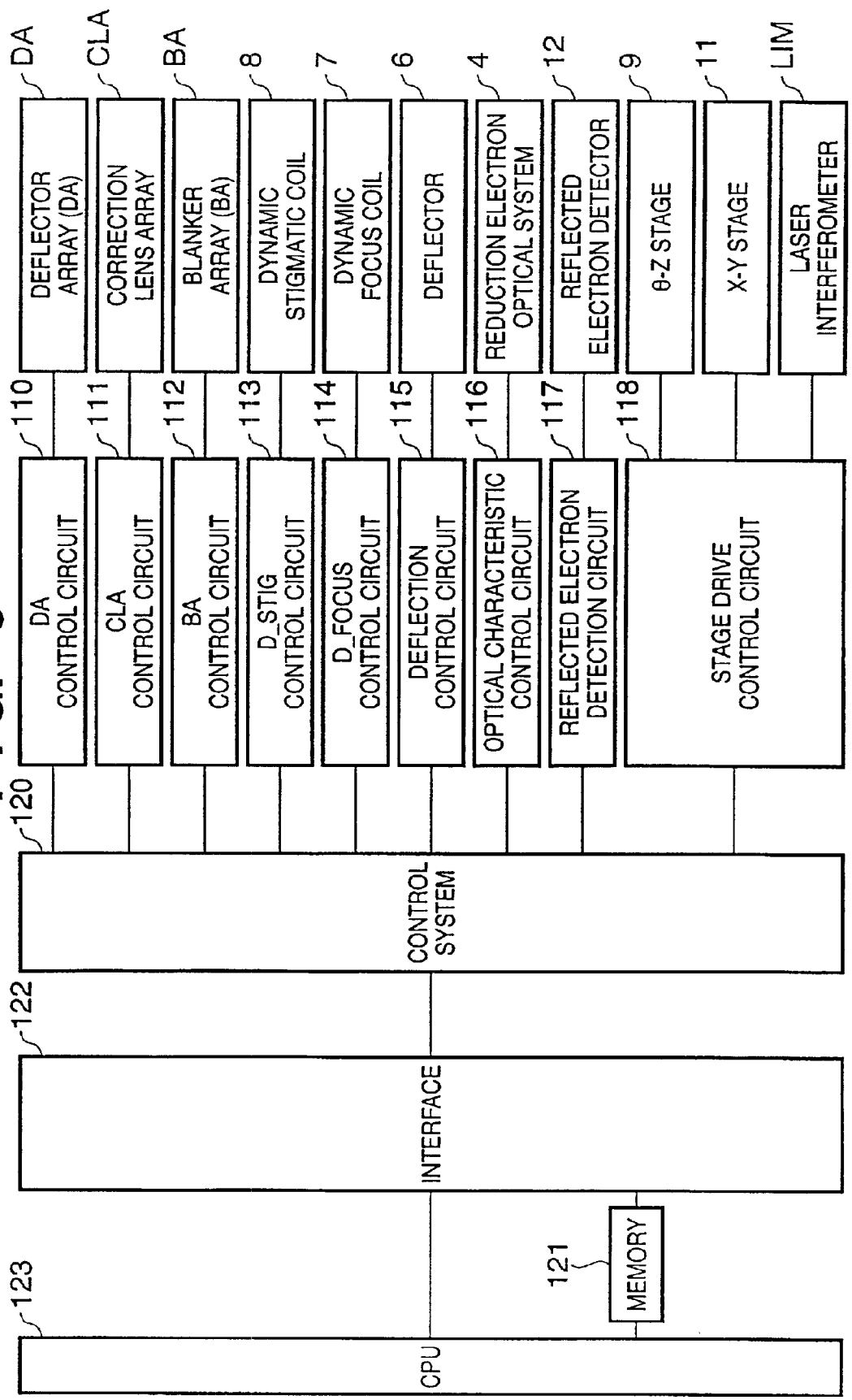
FIG. 5 is a block diagram for explaining the system arrangement of the electron beam exposure apparatus shown in FIG. 1.

The system arrangement of the electron beam exposure apparatus according to this embodiment will be described with reference to FIG. 5. A DA control circuit 110 individually controls the plurality of deflectors (deflection electrodes) that form the deflector array DA. The CLA control circuit 111 individually controls the focal lengths of the plurality of electron lenses UL that form the correction lens array CLA. The BA control circuit 112 individually controls ON/OFF of the plurality of blanking electrodes that form the blanker array BA.

A D_STIG control circuit 113 controls the dynamic stigmatic coil 8 to control the astigmatism of the reduction electron optical system 4. A D_FOCUS control circuit 114 controls the dynamic focus coil 7 to control the focus of the reduction electron optical system 4. A deflection control circuit 115 controls the deflector 6. An optical characteristic control circuit 116 adjusts the optical characteristics (magnification, distortion) of the reduction electron optical system 4. A reflected electron detection circuit 117 calculates the amount of reflected electrons from a signal sent from the reflected electron detector 12.

A stage drive control circuit 118 drive-controls the θ-Z stage 9 and, in cooperation with a laser interferometer LIM that detects the position of the X-Y stage 11, the X-Y stage 11.

A control system 120 reads out exposure control data from a memory 121 which stores it (e.g., including drawing pattern data), and controls the plurality of control circuits described above on the basis of the exposure control data. The control system 120 is controlled by a CPU 123 which controls the entire electron beam exposure apparatus through an interface 122.

The exposure operation of the electron beam exposure apparatus according to this embodiment will be described with reference to FIG. 6.

On the basis of the exposure control data from the memory 121, the control system 120 instructs the deflection control circuit 115 to deflect the plurality of electron beams with the deflector 6. The control system 120 also instructs the BA control circuit 112 to turn on/off the plurality of blanking electrodes of the blanker array BA individually in accordance with a pattern (drawing pattern data) to be drawn on the wafer 5. At this time, the X-Y stage 11 continuously moves in the Y direction. The plurality of electron beams are deflected by the deflector 6 to follow the movement of the X-Y stage 11. The electron beams scan and expose the corresponding element exposure regions (EF) on the wafer 5, as shown in FIG. 6. The element exposure regions (EF) of the respective electron beams are adjacent to each other two-dimensionally. Consequently, a subfield (SF) constituted by the plurality of element exposure regions (EF), which are set to be exposed simultaneously, is exposed simultaneously.

After one subfield (SF1) is exposed, the control system 120 instructs the deflection control circuit 115 to deflect the plurality of electron beams by the deflector 6 in a direction (X direction) perpendicular to the stage scanning direction (Y direction), so that the next subfield (SF2) is exposed. At this time, since the subfields are switched by deflection, the aberration with which the respective electron beams are reduced and projected through the reduction electron optical system 4 also changes. Hence, the control system 120 instructs the BA control circuit 112, D_STIG control circuit 113, and D_FOCUS control circuit 114 to adjust the blanker array BA, dynamic stigmatic coil 8, and dynamic focus coil 7 so as to correct the changed aberration. Thereafter, as described above, the respective electron beams expose the corresponding element exposure regions (EF), thereby exposing the subfield 2 (SF2). As shown in FIG. 6, subfields (SF1 to SF6) are sequentially exposed to expose a pattern onto the wafer 5. As a result, a main field (MF) constituted by the subfields (SF1 to SF6) arranged in a direction (X direction) perpendicular to the stage scanning direction (Y direction) is exposed on the wafer 5.

Figure 6:
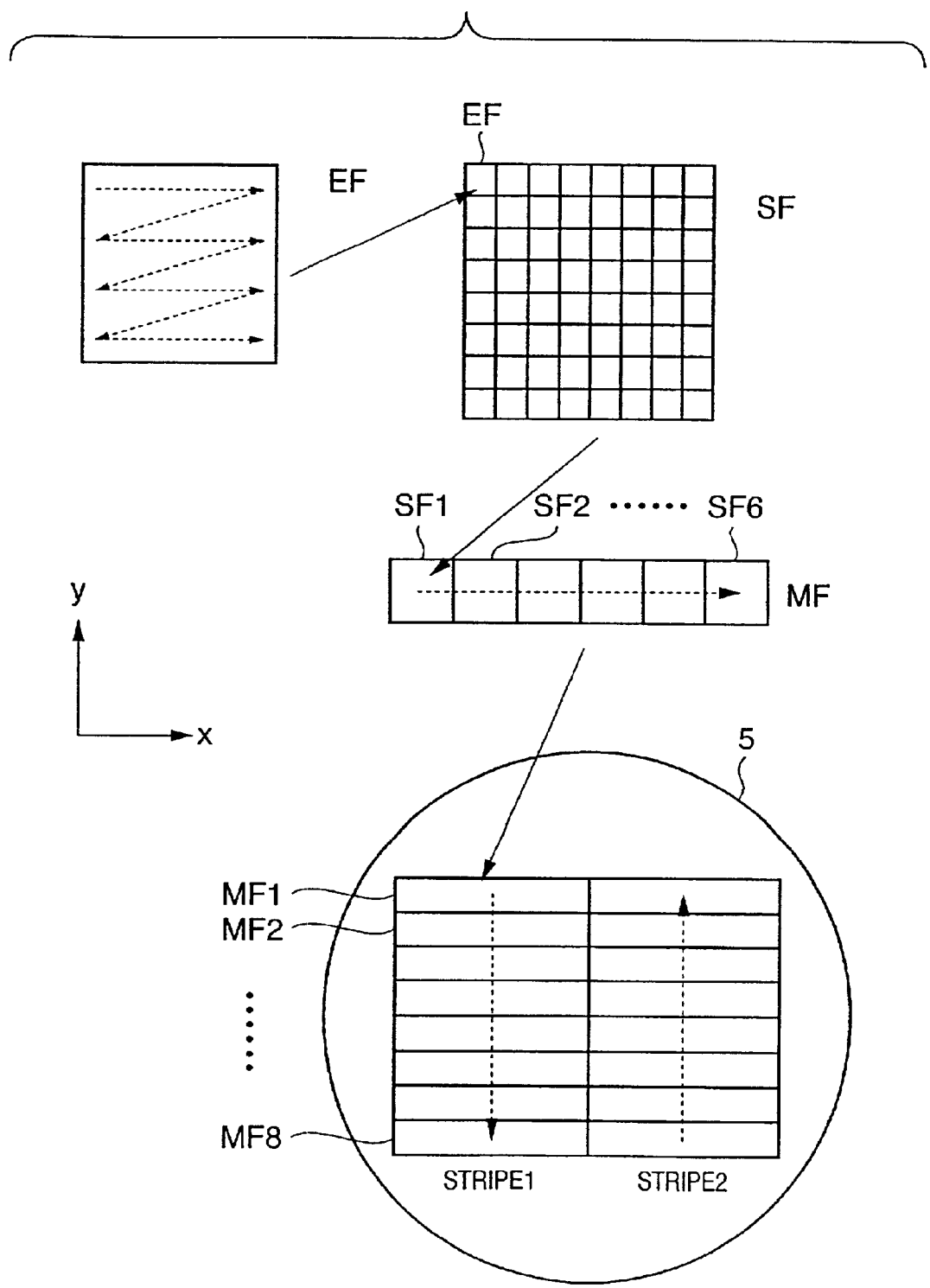
FIG. 6 includes views for explaining an exposure region and an exposure method.

After a main field 1 (MF1) shown in FIG. 6 is exposed, the control system 120 instructs the deflection control circuit 115 to sequentially deflect the plurality of electron beams toward main fields (MF2, MF3, MF4, . . . ) arranged in the stage scanning direction (Y direction), thus exposing them. As a result, as shown in FIG. 6, a stripe (STRIPE1) constituted by the main fields (MF2, MF3, MF4, . . . ) is exposed. Then, the X-Y stage 11 is stepped in the X direction to expose the next stripe (STRIPE2).

A device manufacturing method using the exposure apparatus according to the present invention, represented by the electron beam exposure apparatus described above, will be described.

Figure 7:
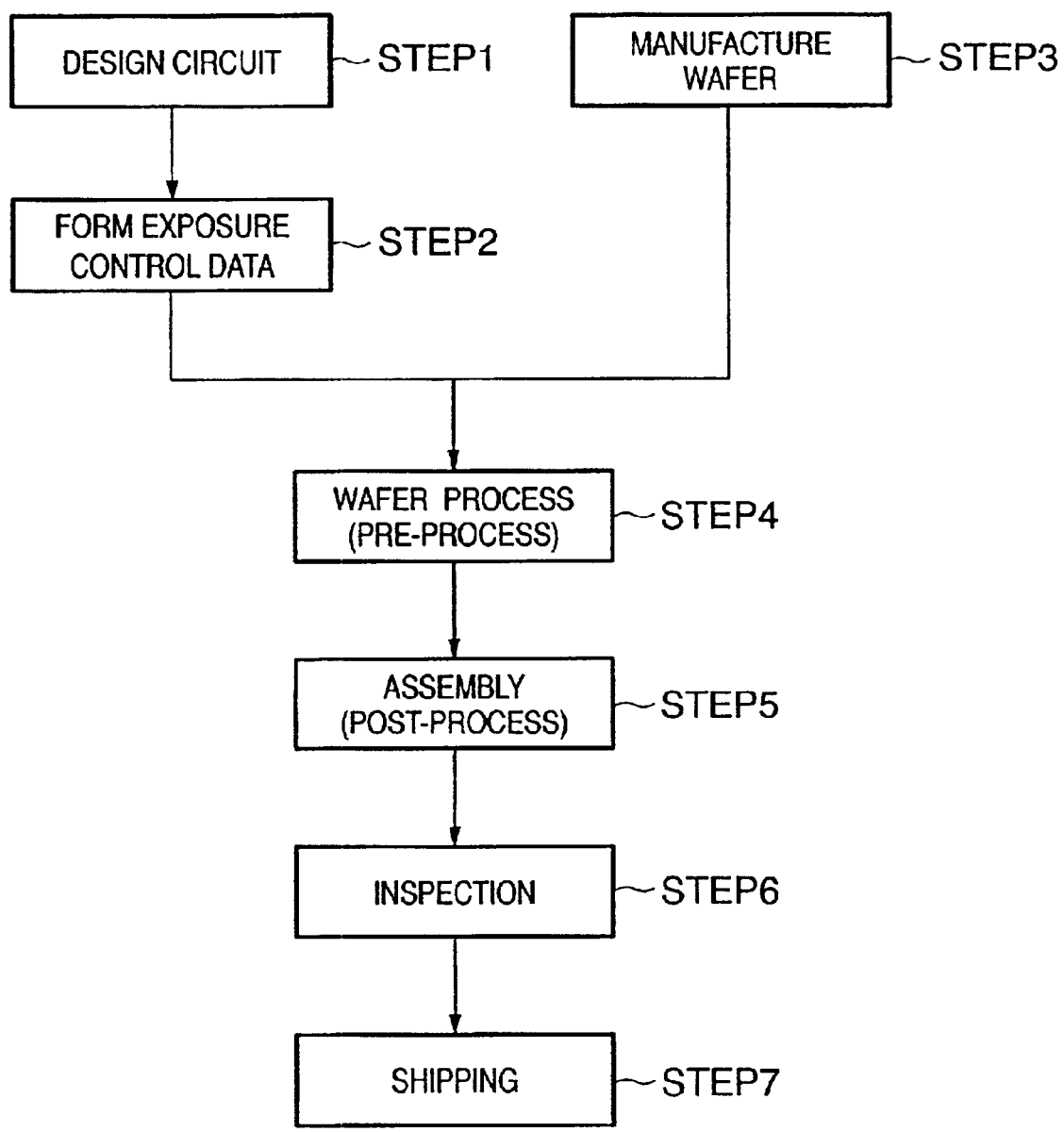
FIG. 7 is a flow chart for explaining the manufacturing flow of a microdevice.

FIG. 7 shows the flow of manufacture of a microdevice (e.g., a semiconductor chip such as an IC or LSI, a liquid crystal panel, a CCD, a thin film magnetic head, a micromachine, or the like). In step 1 (design circuit), a semiconductor device circuit is designed. In step 2 (form exposure control data), the exposure control data of the exposure apparatus is formed on the basis of the designed circuit pattern. In step 3 (manufacture wafer), a wafer is manufactured by using a material such as silicon. In step 4 (wafer process), called a pre-process, an actual circuit is formed on the wafer by lithography using the exposure apparatus, to which the prepared exposure control data has been input, and the wafer. In step 5 (assembly), called a post-process, a semiconductor chip is formed by using the wafer fabricated in step 4, and includes processes such as an assembly process (dicing and bonding) and a packaging process (chip encapsulation). In step 6 (inspection), inspections such as the operation confirmation test and durability test of the semiconductor device manufactured in step 5 are conducted. After these step, the semiconductor device is completed, and shipped (step 7.

Figure 8:
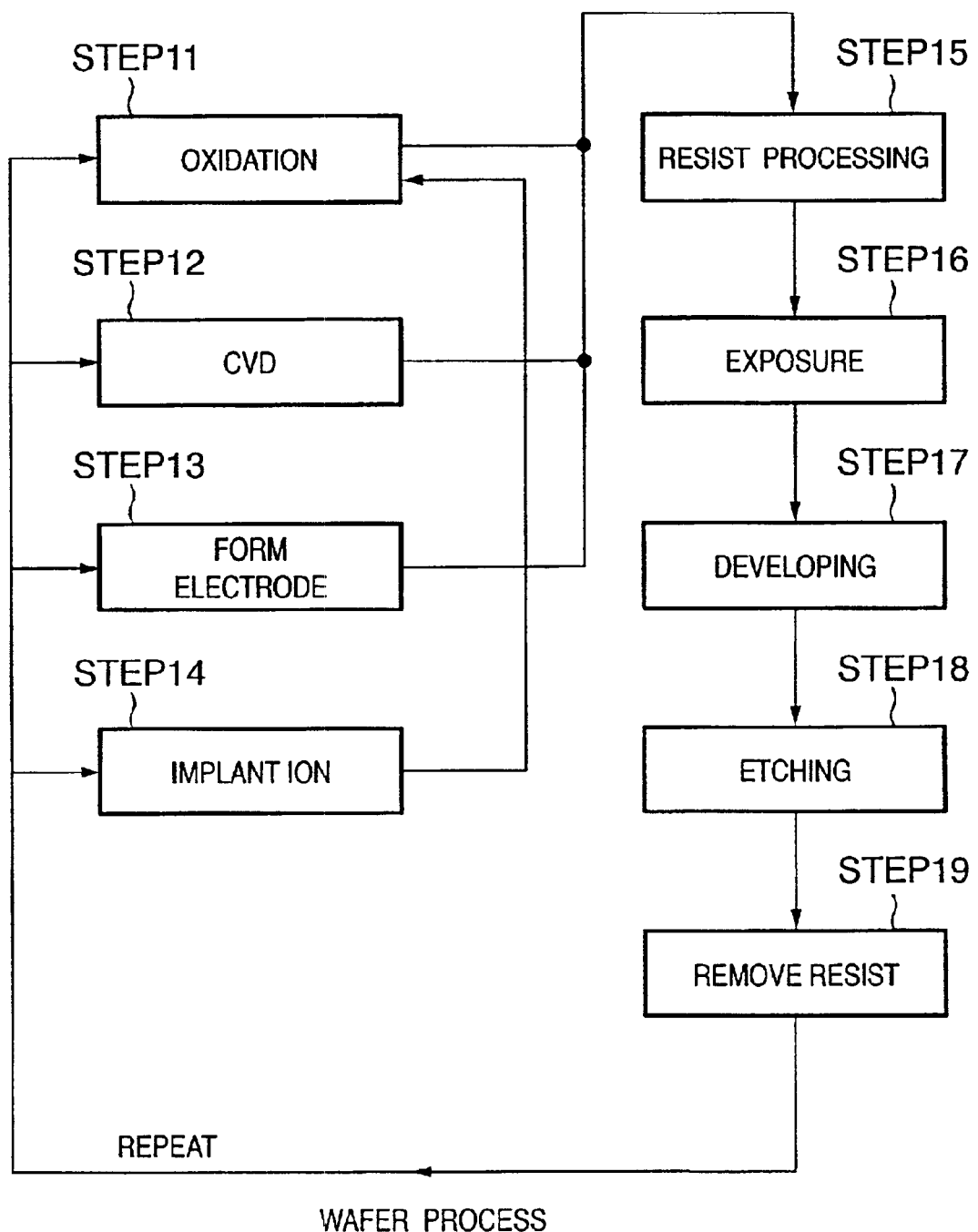
FIG. 8 is a flow chart for explaining a wafer process.

FIG. 8 shows the detailed flow of the wafer process. In step 11 (oxidation), the surface of the wafer is oxidized. In step 12 (CVD), an insulating film is formed on the wafer surface. In step 13 (form electrode), an electrode is formed on the wafer by vapor deposition. In step 14 (implant ion), ions are implanted in the wafer. In step 15 (resist processing), a photosensitive agent is applied to the wafer. In step 16 (exposure), the above-mentioned exposure apparatus exposes the circuit pattern to the wafer. In step 17 (developing), the exposed wafer is developed. In step 18 (etching), the resist is etched except for the developed resist image. In step 19 (remove resist), an unnecessary resist after etching is removed. These steps are repeated to form multiple circuit patterns on the wafer.

With the manufacturing method according to this embodiment, a highly integrated semiconductor device, which is conventionally difficult to manufacture, can be manufactured at a low cost.

Another application field of the present invention includes a charged particle beam applied apparatus, e.g., a length measurement apparatus for measuring the size of a pattern formed on a semiconductor substrate by using a plurality of charged particle beams generated by the arrangement as shown in FIG. 2, a microscope apparatus for observing the pattern state, or an inspection apparatus for inspecting a pattern defect.

According to one aspect of the present invention, a charged particle beam drawing apparatus that can draw a micropattern without increasing the performance of, e.g., a reduction electron optical system, can be provided. If a device is manufactured by using this apparatus, a device with higher precision than that with the prior art can be manufactured.

According to another aspect of the present invention, length measurement, observation, and inspection can be performed within a short period of time with the plurality of generated charged particle beams.

As many apparently widely different embodiments of the present invention can be made without departing from the spirit and scope thereof, it is to be understood that the invention is not limited to the specific embodiments thereof except as defined in the claims.

What is claimed is:

1. A charged particle beam exposure apparatus for exposing a pattern on a substrate by using a plurality of charged particle beams, said apparatus comprising:

a charged particle beam source;

an electron optical element for forming a plurality of intermediate images of said charged particle beam source within or in the vicinity of a plane;

a blanker array having a plurality of blankers, arranged on the plane, for individually controlling whether to shield each of the plurality of charged particle beams;

a reduction electron optical system for reducing and projecting the plurality of intermediate images onto a substrate; and a correction lens array having a plurality of electron lenses, arranged between said blanker array and said reduction electron optical system, for respectively adjusting each virtual image position of the plurality of intermediate images in accordance with an aberration of said reduction electron optical system.

2. The apparatus according to claim 1, wherein the blankers arranged in said blanker array deflect a charged particle beam that should be shielded and do not deflect a charged particle beam that should not be shielded, and said correction lens array has a stopper array for shielding and passing therethrough, among a plurality of charged particle beams passing through the plurality of blankers arranged in said blanker array, deflected and undeflected charged particle beams, respectively.

3. The apparatus according to claim 1, wherein the blankers arranged in said blanker array deflect a charged particle beam that should be shielded and do not deflect a charged particle beam that should not be shielded, and said charged particle beam exposure apparatus further comprises a stopper array for shielding and passing therethrough, among a plurality of charged particle beams passing through the plurality of blankers arranged in said blanker array, deflected and undeflected charged particle beams, respectively.

4. The apparatus according to claim 1, wherein said electron optical element has (i) an aperture array having a plurality of apertures for passing the charged particle beam emitted by said charged particle beam source therethrough, and (ii) a lens array having a plurality of electron lenses for forming the plurality of intermediate images within or in the vicinity of the plane with the plurality of charged particle beams respectively passing through the plurality of apertures.

5. A device manufacturing method including the steps of:

applying a photosensitive material on a substrate;

exposing a pattern on the substrate coated with the photosensitive material with a charged particle beam exposure apparatus, and developing the photosensitive material on the substrate exposed to the pattern, the charged particle beam exposure apparatus comprising (i) a charged particle beam source, (ii) an electron optical element for forming a plurality of intermediate images of the charged particle source within or in the vicinity of a plane, (iii) a blanker array having a plurality of blankers arranged on the plane for individually controlling whether to shield each of the plurality of charged particle beams, (iv) a reduction electron optical system for reducing and projecting the intermediate images onto a substrate, and (v) a correction lens array having a plurality of electron lenses, arranged between said blanker array and said reduction electron optical system, for respectively adjusting each virtual image position of the plurality of intermediate images in accordance with an aberration of said reduction electron optical system.

6. A charged particle beam applied apparatus comprising:

a charged particle beam source, an electron optical element for forming a plurality of intermediate images of said charged particle beam source within or in the vicinity of a plane, a blanker array having a plurality of blankers arranged on the plane for individually controlling whether to shield each of the plurality of charged particle beams, a reduction electron optical system for reducing and projecting the plurality of intermediate images onto a substrate, and a correction lens array having a plurality of electron lenses, arranged between said blanker array and said reduction electron optical system, for respectively adjusting each virtual image position of the plurality of intermediate images in accordance with an aberration of said reduction electron optical system.

7. A charged particle beam exposure apparatus for exposing a pattern on a substrate by using a plurality of charged particle beams, said apparatus comprising:

an electron optical element for focusing each of the plurality of charged particle beams within or in the vicinity of a plane;

a blanker array having a plurality of blankers arranged on the plane, for individually controlling whether to shield each of the plurality of charged particle beams;

an electron optical system for projecting the plurality of charged particle beams from said blanker array onto a substrate; and a correction lens array having a plurality of electron lenses, arranged between said blanker array and said reduction electron optical system, for respectively adjusting each virtual image position of the plurality of intermediate images in accordance with an aberration of said reduction electron optical system.

* * * * *